United States Patent [19]

Roberts

[11] Patent Number: 4,987,089
[45] Date of Patent: Jan. 22, 1991

[54] BICMOS PROCESS AND PROCESS FOR FORMING BIPOLAR TRANSISTORS ON WAFERS ALSO CONTAINING FETS

[75] Inventor: Ceredig Roberts, Boise, Id.

[73] Assignee: Micron Technology, Inc., Boise, Id.

[21] Appl. No.: 556,907

[22] Filed: Jul. 23, 1990

[51] Int. Cl.$^5$ .......................................... H01L 21/265
[52] U.S. Cl. ........................................ 437/34; 437/31;
  437/46; 437/56; 437/59; 437/29; 437/186;
  437/57; 148/DIG. 9; 148/DIG. 82
[58] Field of Search .................... 437/34, 46, 193, 31,
  437/29, 59, 162, 152, 155, 56, 57, 186;
  148/DIG. 9, DIG. 82, DIG. 105; 357/43

[56] References Cited

U.S. PATENT DOCUMENTS

| | | | |
|---|---|---|---|
| 4,475,279 | 10/1984 | Gahle | 437/59 |
| 4,637,125 | 1/1987 | Iwasaki et al. | 437/152 |
| 4,722,908 | 2/1988 | Burton | 437/152 |
| 4,764,480 | 8/1988 | Vora | 437/56 |
| 4,808,548 | 2/1989 | Thomas et al. | 148/DIG. 10 |
| 4,849,364 | 7/1989 | Scovell et al. | 437/31 |
| 4,874,717 | 10/1989 | Neppl et al. | 437/59 |
| 4,891,328 | 1/1990 | Gris | 437/34 |
| 4,927,776 | 5/1990 | Soejima | 357/43 |

Primary Examiner—Brian E. Hearn
Assistant Examiner—Tuan Nguyen
Attorney, Agent, or Firm—Wells, St. John & Roberts

[57] ABSTRACT

A process for fabricating integrated circuits containing bipolar transistors in semiconductor wafers comprising the following steps:

forming a well and an upper insulating layer on a semiconductor wafer;

selectively patterning and doping a bipolar transistor base implant region into the well;

selectively patterning a layer of conductive material atop the insulating layer, the conductive material layer selectively exposing a first area of the base implant region and covering other areas of the base implant region, the conductive material layer having at least one first edge which at least in part defines the exposed first area;

doping through the exposed first area to form an emitter implant region within the base implant region, the conductive material layer masking without photoresist the other covered areas of the base implant region during doping of the exposed first area; then patterning the layer of conductive material to expose a second area of the base implant region and to form gates of MOS transistors elsewhere in the integrated circuits, the patterning to expose the second area defining at least one second conductive material edge atop the base implant region;

masking the first area and exposing the second area with photoresist; and doping through the exposed second area to form a base contact.

16 Claims, 5 Drawing Sheets

BICMOS PROCESS AND PROCESS FOR FORMING BIPOLAR TRANSISTORS ON WAFERS ALSO CONTAINING FETS

TECHNICAL FIELD

This invention relates generally to BiCMOS processes, and processes for fabricating integrated circuits containing bipolar transistors.

BACKGROUND OF THE INVENTION

Semiconductor chips are comprised of a series of integrated circuits and devices which include transistors. Transistors are of two general types, namely bipolar and field effect transistors (alternately termed FET). Bipolar transistors are comprised of regions and junctions of p-type and n-type material, and are comprised of either "npn" or "pnp" configurations. The three regions are designated as an emitter, a base and a collector. One common type of FET transistors are MOS transistors. These are also comprised of three regions termed a drain, a gate and a source. In operation of a MOS transistor, a voltage applied to the gate region causes a conductive channel to form between the source and drain within the substrate, resulting in current flow.

Complementary MOS (CMOS) is a MOS circuit formed with both n-channel and p-channel devices, namely an n-type transistor (nMOS) and a p-type transistor (pMOS). The nMOS transistors have the source and drain regions formed of n-type material in a p-type substrate or p-well, while pMOS transistors have source and drains formed of a p-type material in an n-type substrate or n-well. CMOS allows more powerful circuit operation than either n-channel or p-channel circuits alone. This factor, combined with the lower power consumption and increased speed, has made CMOS the favored technology for the manufacture of microprocessors and memory devices.

In certain situations, it is desirable to form bipolar transistors within substrate wells containing CMOS transistors. Such processes are commonly known as BiCMOS processes.

In wafer fabrication, circuit formation in and on the wafer requires many sophisticated processes. The actual number of steps the wafer goes through will vary with the type and complexity of the circuit being built. CMOS and BiCMOS processes tend to include large numbers of individual processing steps, which include several masking steps. Despite the many steps, only three basic operations are performed on a wafer:

layering—thin layers of different materials are grown on, or added to the wafer surface.
  patterning—portions of thin layers are defined and selectively removed or etched from the wafer.
  doping—the resistivity and conductivity type of selected regions in the wafer are changed by the addition of dopants.

It would be desirable to incorporate bipolar devices into a CMOS process (i.e., BiCMOS) without adding additional masking steps. It would also be desirable to devise processes for formation of bipolar transistors in semiconductor wafers which minimize the number of masking steps.

BRIEF DESCRIPTION OF THE DRAWINGS

Preferred embodiments of the invention are described with reference to the accompanying drawings.

DETAILED DESCRIPTION OF THE PREFERRED EMBODIMENTS

The following disclosure of the invention is submitted in furtherance with the constitutional purpose of the Patent Laws "to promote the progress of science and useful arts" (Article 1, Section 8).

In accordance with one aspect of the invention, a process for fabricating integrated circuits containing bipolar transistors in semiconductor wafers comprises the following steps:

forming a well and an upper insulating layer on a semiconductor wafer;
  selectively patterning and doping a bipolar transistor base implant region into the well;
  selectively patterning a layer of conductive material atop the insulating layer, the conductive material layer selectively exposing a first area of the base implant region and covering other areas of the base implant region, the conductive material layer having at least one first edge which at least in part defines the exposed first area;
  doping through the exposed first area to form an emitter implant region within the base implant region, the conductive material layer masking without photoresist the other covered areas of the base implant region during doping of the exposed first area; then patterning the layer of conductive material to expose a second area of the base implant region and to form gates of MOS transistors elsewhere in the integrated circuits, the patterning to expose the second area defining at least one second conductive material edge atop the base implant region;
  masking the first area and exposing the second area with photoresist; and
  doping through the exposed second area to form a base contact.

Such a process can be incorporated into a BiCMOS fabrication process employing either p-type or n-type semiconductor wafers. Such a BiCMOS process is described below first with reference to fabricating BiCMOS integrated circuits in p-type semiconductor wafers, and with reference to FIGS. 1–4.

Our U.S. application Ser. No. 427,639, filed on Oct. 27, 1989, and entitled "Split-Polysilicon Process" is hereby incorporated by reference.

Figure 1:
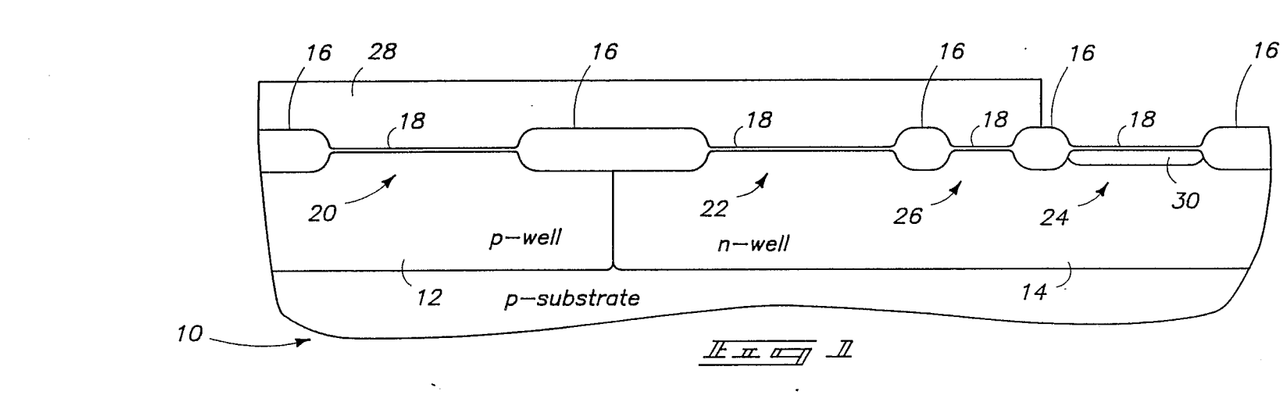
FIG. 1 is a diagrammatic section view of a portion of semiconductor wafer at a processing step in accordance with the invention.

Referring first to FIG. 1, a p-type semiconductor wafer is indicate generally with reference numeral 10. Formed on or within p-type wafer 10 are a p-well 12, an n-well 14, and overlying thick and thin portions 16, 18 respectively, of insulating oxide material. Example p-type and n-type dopant materials include phosphorus or arsenic and boron or $BF_2$, respectively. Example concentrations of the p-substrate, p-well, and n-well would be $5E14$ cm$^{-3}$, $1E16$ cm$^{-3}$, and $1E16$ cm$^{-3}$, respectively.

Wafer 10 with oxide portions 16, 18 defines a first portion 20 in p-well 12 for formation of an n-channel MOS transistor. Also defined is a second portion 22 in n-well 14 for formation of a p-channel MOS transistor. Also defined is a third portion 24 in n-well 14 for formation of a bipolar npn transistor. Also defined is a fourth portion 26 in the same n-well 14 containing third portion 24 for formation of a collector contact within such n-well.

FIG. 1 illustrates wafer 10 having been selectively patterned with a resist mask layer 28 to expose third portion 24 through overlying thin oxide layer 18, while covering other regions of the upper portion of wafer 10. A base implant of p-type material 30 is provided through thin oxide layer 18 into third portion 24 as indicated. Dopant concentration would typically be, by way of example only, $1E18$ cm$^{-3}$.

Figure 2:
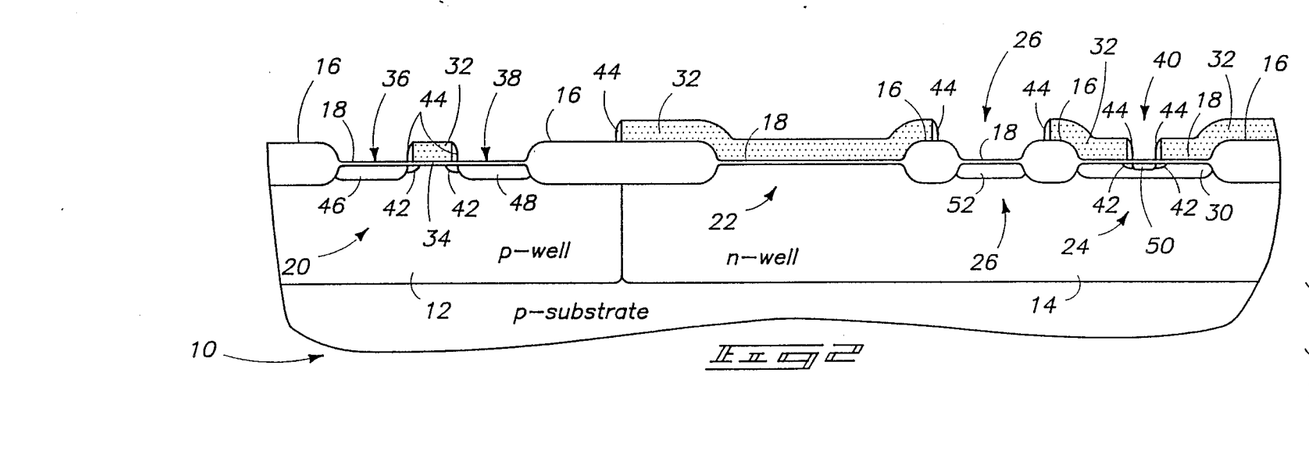
FIG. 2 is a diagrammatic section view of the semiconductor wafer of FIG. 1 at a subsequent processing step.

Referring to FIG. 2, a layer 32 of conductive material is applied and selectively patterned atop oxide regions 16 and 18 to, (a) define a gate 34 and exposed source and drain areas 36, 38 respectively, of an n-channel MOS transistor to be formed in first portion 20; (b) cover second portion 22; (c) to selectively expose an area 40 of base implant region 30 within third portion 24 and to cover remaining areas of p-implanted third portion 24; and (d) to selectively expose fourth portion 26.

At this point, the exposed areas are doped with n-type dopant material to a selected first concentration (by way of example, $5E10^{17}$ cm$^{-3}$). This first concentration implant will be used to ultimately form lightly doped drain regions 42 in p-well 12 and p-implanted third portion 24 within n-well 14. Conductive material layer 32 masks, without use of photoresist, second portion 22 and covered areas of third portion 24 from implantation of n-type dopant material during this first concentration doping. Use of layer 32 in such manner eliminates an otherwise required additional masking step. Such first concentration doping would also effectively provide a doped region of n-material within fourth portion 26, area 40 of portion 24, and source and drain areas 36, 38 in first portion 20 of p-well 12.

Insulating oxide spacers 44 would then be formed on exposed edges of the patterned conductive material layer 32 which would overlie at least portions of first and third portions 20, 24 respectively, and cover portions of the n-type implant therein to enable formation of lightly doped drain regions 42.

Exposed areas would then be again doped with n-type dopant material to a selected concentration which is greater than the first concentration to form a source implant 46 and drain implant 48 in first portion 20 of p-well 12. An example second concentration of the n-type dopant material would be $1E10^{20}$ cm$^{-3}$. The second concentration doping step would also form a second concentration n-type emitter implant region 50 in p-implanted third portion 24, and a second concentration n-type collector contact region implant 52 in fourth portion 26. During such second concentration doping step, conductive material layer 32 masks (without use of photoresist) second portion 22 and covered areas of third portion 24 from implantation of n-type dopant material.

Figures 3, 4:
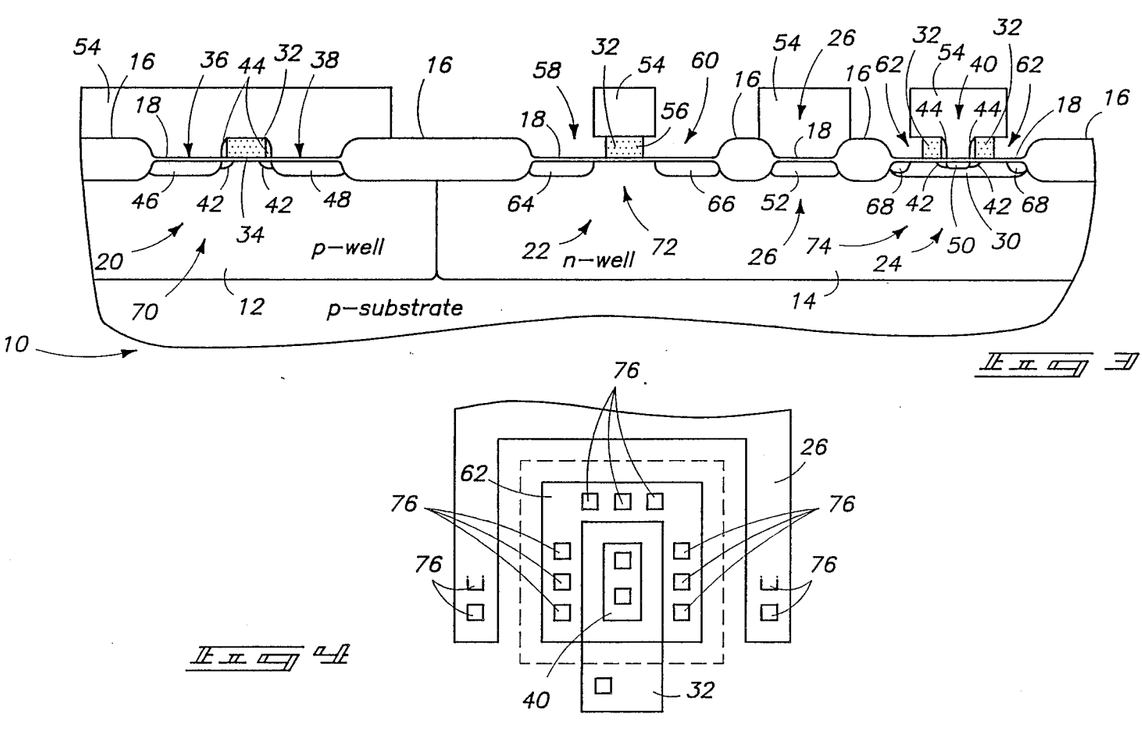
FIG. 3 is a diagrammatic section view of the semiconductor wafer of FIG. 1 at a processing step subsequent to that shown by FIG. 2.
FIG. 4 is an overhead plan view of the semiconductor wafer of FIG. 1 at a processing step subsequent to that shown by FIG. 3.

Referring to FIG. 3, a layer of photoresist 54 is applied and photoexposed as indicated, and polysilicon layer 32 further etched, to selectively pattern a gate 56 and expose source and drain areas 58, 60 respectively, of the p-channel MOS transistor to be formed in second portion 22 of n-well 14. Photoresist layer 54 is also patterned to cover emitter implant 50 in p-implanted third portion 24 and expose base contact regions 62 in p-implanted third portion 24. Such patterning with photoresist also covers collector contact implant region 52 in fourth portion 26, and covers the entirety of first portion 20 in p-well 12.

Exposed areas are then doped with p-type dopant material to a selected third concentration (for example $1E10^{20}$ cm$^{-3}$) to form a source implant 64 and a drain implant 66 in second portion 22, and also to form third concentration base contact implant regions 68 within p-implanted base region 30.

Thus, such a process enables formation of an nMOS transistor 70 within p-well 12 and a pMOS transistor 72 within n-well 14, as well as formation of a bipolar transistor 74 within n-well 14, without significant added processing or masking steps by using portions of conductive layer 32 as a mask.

In the preferred embodiment, the recited conductive material would everywhere be conductively doped polysilicon.

FIG. 4 is an enlarged plan view of the wafer formed by FIG. 3 at a subsequent process step. Another layer of insulating material has been applied (not perceivable from the view). Then, multiple discrete contacts 76 are etched downwardly through the insulating layer and thin oxide regions 18 for the emitter and base contacts as indicated.

Figure 5:
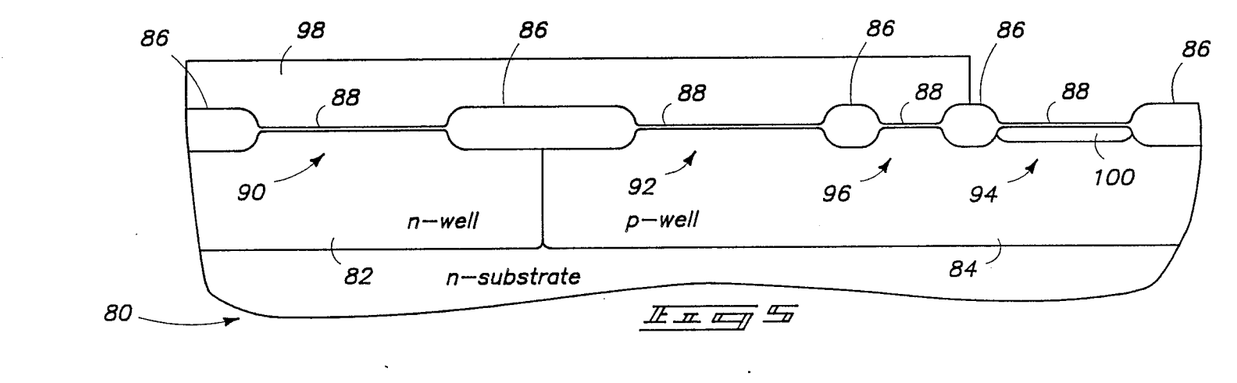
FIG. 5 is a diagrammatic section view of an alternate semiconductor wafer at a processing step in accordance with the invention.
Figure 6:
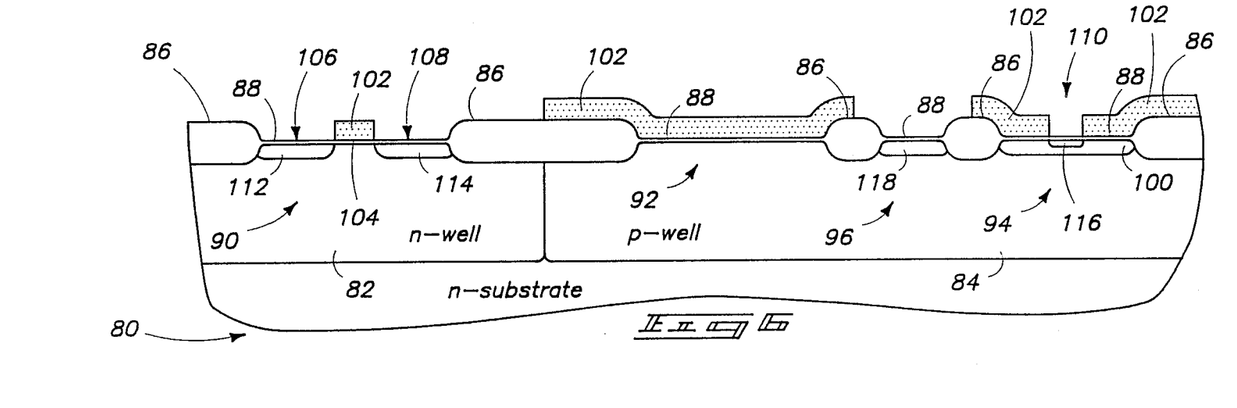
FIG. 6 is a diagrammatic section view of the FIG. 5 wafer at a processing step subsequent to that shown by FIG. 5.
Figure 7:
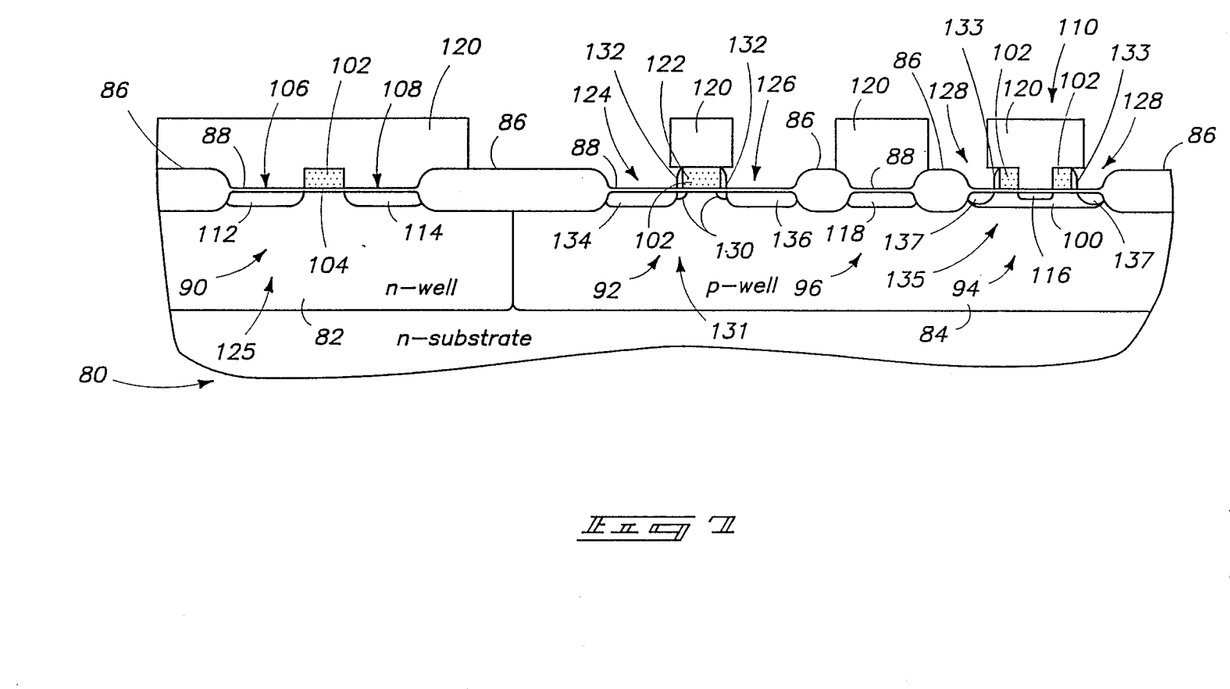
FIG. 7 is a diagrammatic section view of the FIG. 5 wafer at a processing step subsequent to that shown by FIG. 6.

Reference is now made to FIGS. 5–7 for description of a process for fabricating BiCMOS integrated circuits in n-type semiconductor substrate wafers. Referring first to FIG. 5, an n-type semiconductor wafer is indicated generally by reference numeral 80. Formed within wafer 80 are an n-well 82, a p-well 84 and overlying thick and thin regions 86, 88 respectively. Example concentrations of the n-substrate, n-well, and p-well would be $5E14$ cm$^{-3}$, $1E16$ cm$^{-3}$, and $1E16$ cm$^{-3}$, respectively. Thick and thin oxide regions 86, 88 respectively, define (a) a first portion 90 in n-well 82 for formation of a p-channel MOS transistor; (b) a second portion 92 in p-well 84 for formation of an n-channel MOS transistor; (c) a third portion 94 in p-well 84 for formation of a bipolar pnp transistor; and (d) a fourth portion 96 in the same p-well 84 containing third portion 94 for formation of a collector contact in such p-well.

A layer of photoresist 98 is applied and selectively patterned as indicated to expose third portion 94. Third portion 94 is thereafter doped to provide an n-type base implant 100 within p-well 84. An example concentration would be $1E10^{18}$ cm$^{-3}$.

Referring to FIG. 6, a conductive material layer 102 is applied and selectively patterned atop oxide region 86, 88 to define a gate 104 and exposed source and drain areas 106, 108 respectively, of the p-channel MOS transistor to be formed in first portion 82. Conductive material layer 102 is also patterned to cover second portion 92. It is also patterned to selectively expose an area 110 of the n-implanted region 100 of third portion 94 and cover remaining areas of n-implanted third portion 94. It is further selectively patterned to expose fourth portion 96.

The exposed areas are doped with p-type dopant material to a selected first concentration (such as for example $1E10^{20}$ cm$^{-3}$) to form a source implant 112 and drain implant 114 in first portion 90 of n-well 82. The first concentration doping also provides an emitter implant 116 within n-base implant 100 of third portion 94, and a collector contact implant region 118 in fourth portion 96. During such doping, layer 102 masks (without photoresist) the covered areas.

Referring now to FIG. 7, a photoresist layer 120 is applied, masked and photoexposed. Then conductive material 102 is further etched to selectively pattern and define a gate 122 and exposed source and drain areas 124, 126 respectively, of the n-channel MOS transistor to be formed in second portion 92 within p-well 84. The photoresist is also selectively patterned to cover emitter implant 116 within p-implanted third portion 94 and expose base contact regions 128 within base implant 100. Photoresist layer 120 is also selectively patterned to cover collector contact implant region 118 of fourth portion 96, and to completely cover first portion 90 within n-well 82.

Exposed areas 124, 126 and 128 are then doped with n-type dopant material to a selected second concentration (for example $1E10^{17}$ cm$^{-3}$). This second concentration doping will ultimately form lightly doped drain regions 130 in areas 124, 126 respectively, in second region 92. It also begins formation of base contact implant regions 137 within base implant region 100.

Insulating oxide spacers 132 are then formed on the opposed exposed edges of gate 122 within second portion 92 to cover portions of regions 130 formed therein. Such a step will also form insulating oxide layers 133 on the exposed outer edges of conductive material 102 overlying base implant 100. Exposed source and drain areas 124, 126 respectively, as well as exposed area 128, are then doped with n-type dopant material to a selected third concentration which is greater than the second concentration (for example $1E10^{20}$ cm$^{-3}$). This forms a source implant 134 and a drain implant 136 within second portion 92, and more fully concentrates base contact implant regions 137 within p-implant 100 within third portion 94.

Thus, such a process enables formation of a pMOS transistor 125 within n-well 82 and an nMOS transistor 131 within p-well 84, as well as formation of a bipolar transistor 135 within p-well 84, without significant added processing or masking steps by using portions of conductive layer 102 as a mask.

Figure 8:
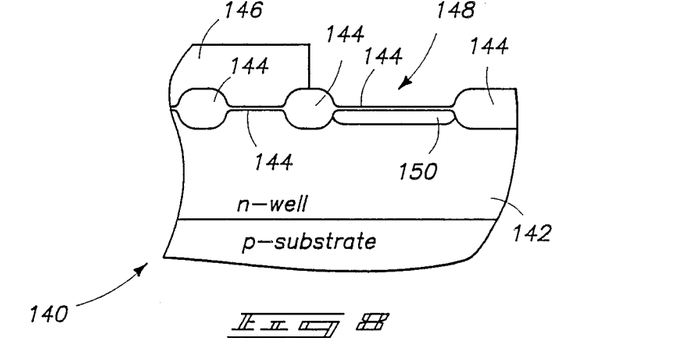
FIG. 8 is a diagrammatic section view of yet another alternate semiconductor wafer at a processing step in accordance with the invention.
Figure 9:
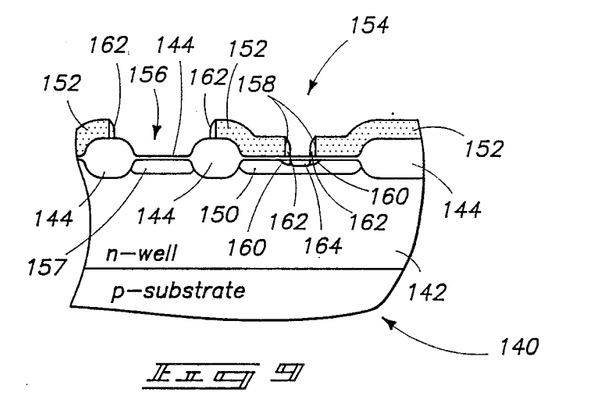
FIG. 9 is a diagrammatic section view of the FIG. 8 wafer at a process step subsequent to that shown by FIG. 8.
Figure 10:
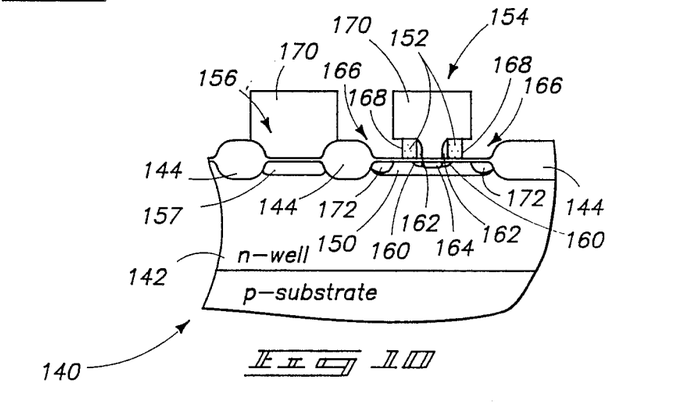
FIG. 10 is a diagrammatic section view of the FIG. 8 wafer at a processing step subsequent to that shown by FIG. 9.

Reference is now made to FIGS. 8–10 for a description of utilization of aspects of the invention apart from a CMOS or BiCMOS process. This aspect of the invention comprises a process for fabricating integrated circuits containing bipolar transistors in semiconductor wafers. The process is described for formation of an npn transistor. Those skilled in the art will readily perceive analogous processing steps for formation of a pnp transistor, at least as assisted by the above disclosure with reference to FIGS. 5–7.

Referring first to FIG. 8, a semiconductor wafer is indicated generally with reference numeral 140. A well 142 and upper, various thickness oxide layer 144 is formed in or on wafer 140. In the illustrated embodiment, substrate wafer 140 is of p-type material with well 142 being of n-type material. A layer of photoresist 146 has been applied and selectively patterned to expose an area 148 where the bipolar transistor will be formed. Wafer 140 is then doped to form a bipolar transistor base implant 150 within area 148. As illustrated, the base implant is of p-type material for formation of an npn bipolar transistor.

Referring to FIG. 9, a layer 152 of conductive material is applied and patterned atop oxide layer 144 to selectively expose (a) a first area 154 of base implant region 150 and covering other areas of base implant region 150, and (b) a collector contact area (third area) 156. Conductive material layer 152 has a pair of opposed first edges 158 which define exposed first area 154.

Collector contact area 156 and first area 154 are doped with n-type dopant material to a selected first concentration (for example $5E10^{17}$ cm$^{-3}$). This will be used to ultimately form lightly doped drain regions 160 in p-type base 150. Simultaneously, doping of the first concentration occurs within collector contact area 156 to begin formation of a collector contact implant 157. During such doping, conductive material layer 152 masks, without use of photoresist, other covered areas of transistor base implant region 150. Insulating oxide spacers 162 are then formed on exposed edges 158 overlying base implant 150, as well as the exposed edges of conductive material 152 which open to define collector contact area 156.

Thereafter, collector contact area 156 and area 154 are doped with n-type material to a selected second concentration which is greater than the first concentration (for example $1E10^{20}$ cm$^{-3}$). This forms an emitter implant region 164, as well as completes definition of LDD regions 160 and collector contact implant 157. Again during this second concentration dopant step, conductive material layer 152 masks, without photoresist, the other covered areas of base implant region 150.

Referring next to FIG. 10, a photoresist layer 170 is applied and photoexposed atop layer 152, and then layer 152 further etched, to expose second areas 166 of base implant region 150, and to form gates of MOS transistors elsewhere in the integrated circuits being formed on the wafer (not shown). Such patterning defines a pair of second conductive material edges 168 atop base implant region 150, and as well masks first area 154 and third area 156.

Second areas 166 are then doped through with p-type material to form base contact implant regions 172. An example concentration would be $1E10^{20}$ cm$^{-3}$.

In accordance with the preferred embodiment of this aspect of the invention, one of the first or second edges 158, 168 respectively is provided with an insulating oxide spacer, while the other is not. Conductive material layer 152 in this manner is used to provide a temporary masking function which nevertheless remains permanently atop the bipolar transistor within the finished wafer.

In compliance with the statute, the invention has been described in language more or less specific as to structural and methodical features. It is to be understood, however, that the invention is not limited to the specific features shown and described, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

I claim:

1. A process for fabricating BiCMOS integrated circuits in p-type semiconductor wafers comprising the following steps:

forming a p-well, an n-well, and overlying field and gate insulating layers in a p-type wafer; defining a first portion in the p-well for formation of an n-channel MOS transistor, a second portion in an n-well for formation of a p-channel MOS transistor, a third portion in an n-well for formation of a bipolar npn transistor, and a fourth portion in the n-well containing the third portion for formation of a collector contact in such n-well;

selectively patterning and doping a p-type base implant into the third portion;

selectively patterning a layer of conductive material atop the field and gate insulating layers to define a gate and exposed source and drain areas of the n-channel MOS transistor in the first portion, to cover the second portion, to selectively expose an area of the p-implanted third portion and to cover remaining areas of the p-implanted third portion, and to selectively expose the fourth portion;

doping exposed areas with n-type dopant material to a selected first concentration to form lightly doped drain regions in the p-well and the p-implanted third portion, the layer of conductive material masking without use of photoresist the second portion and covered areas of the third portion from implantation of n-type dopant material during the first concentration doping;

forming insulating spacers on exposed edges of the patterned conductive material to overlie at least the first and third portions and cover portions of the lightly doped drain regions therein;

doping exposed areas with n-type dopant material to a selected second concentration which is greater than the first concentration to form a source and a drain in the first portion, an emitter in the p-implanted third portion, and a collector contact region in the fourth portion, the layer of conductive material masking without use of photoresist the second portion and covered areas of the third portion from implantation of n-type dopant material during the second concentration doping;

selectively patterning with photoresist to define a gate and exposed source and drain areas of the p-channel MOS transistor in the second portion, to cover the emitter in the p-implanted third portion and expose a base contact region in the p-implanted third portion, to cover the collector contact region of the fourth portion, and to cover the first portion; and doping exposed areas with p-type dopant material to a selected third concentration to form a source and a drain in the second portion and a base contact region in the p-implanted third portion.

2. The process for fabricating BiCMOS integrated circuits of claim 1 wherein the recited conductive material is everywhere conductively doped polysilicon.

3. The process for fabricating BiCMOS integrated circuits of claim 1 wherein the p-channel MOS transistor and bipolar transistor are formed in a single n-well.

4. The process for fabricating BiCMOS integrated circuits of claim 1 wherein, the recited conductive material is everywhere conductively doped polysilicon; and the p-channel MOS transistor and bipolar transistor are formed in a single n-well.

5. The process for fabricating BiCMOS integrated circuits of claim 1 further comprising doping multiple discrete contacts for the emitter and for the base contacts.

6. The process for fabricating BiCMOS integrated circuits of claim 5 wherein, the recited conductive material is everywhere conductively doped polysilicon; and the p-channel MOS transistor and bipolar transistor are formed in a single n-well.

7. A process for fabricating BiCMOS integrated circuits in n-type semiconductor wafers comprising the following steps:

forming an n-well, a p-well, and overlying field and gate insulating layers on an n-type wafer; defining a first portion in the n-well for formation of a p-channel MOS transistor, a second portion in a p-well for formation of an n-channel MOS transistor, a third portion in a p-well for formation of a bipolar PNP transistor, and a fourth portion in the p-well containing the third portion for formation of a collector contact in such p-well;

selectively patterning and doping an n-type base implant into the third portion;

selectively patterning a layer of conductive material atop the field and gate insulating layers to define a gate and exposed source and drain areas of the p-channel MOS transistor in the first portion, to cover the second portion, to selectively expose an area of the n-implanted third portion and cover remaining areas of the n-implanted third portion, and to selectively expose the fourth portion;

doping exposed areas with p-type dopant material to a selected first concentration to form a source and a drain in the first portion, an emitter in the n-implanted third portion, and a collector contact region in the fourth portion;

selectively patterning with photoresist to define a gate and exposed source and drain areas of the n-channel MOS transistor in the second portion, to cover the emitter in the p-implanted third portion and expose a base contact region in the p-implanted third portion, to cover the collector contact region of the fourth portion, and to cover the first portion;

doping exposed areas with n-type dopant material to a selected second concentration to form lightly doped drain regions in the second portion;

forming insulating spacers on exposed edges of the patterned conductive material overlying at least the second portion to cover portions of the lightly doped drain regions therein; and doping exposed areas with n-type dopant material to a selected third concentration which is greater than the second concentration to form a source and a drain in the second portion and a base contact region in the p-implanted third portion.

8. The process for fabricating BiCMOS integrated circuits of claim 7 wherein the recited conductive material is everywhere conductively doped polysilicon.

9. The process for fabricating BiCMOS integrated circuits of claim 7 wherein the n-channel MOS transistor and bipolar transistor are formed in a single p-well.

10. The process for fabricating BiCMOS integrated circuits of claim 7 wherein, the recited conductive material is everywhere conductively doped polysilicon; and the n-channel MOS transistor and bipolar transistor are formed in a single p-well.

11. The process for fabricating BiCMOS integrated circuits of claim 7 further comprising doping multiple discrete contacts for the emitter and for the base contacts.

12. The process for fabricating BiCMOS integrated circuits of claim 11 wherein, the recited conductive material is everywhere conductively doped polysilicon; and the n-channel MOS transistor and bipolar transistor are formed in a single p-well.

13. A process for fabricating integrated circuits containing bipolar transistors in semiconductor wafers comprising the following steps:

forming a well and an upper insulating layer on a semiconductor wafer;

selectively patterning and doping a bipolar transistor base implant region into the well;

selectively patterning a layer of conductive material atop the insulating layer, the conductive material layer selectively exposing a first area of the base implant region and covering other areas of the base implant region, the conductive material layer having at least one first edge which at least in part defines the exposed first area;

doping through the exposed first area to form an emitter implant region within the base implant region, the conductive material layer masking without photoresist the other covered areas of the base implant region during doping of the exposed first area;

patterning the layer of conductive material to expose a second area of the base implant region and to form gates of MOS transistors elsewhere in the integrated circuits, the patterning to expose the second area defining at least one second conductive material edge atop the base implant region and also masking the first area with photoresist; and doping through the exposed second area to form a base contact.

14. The process for fabricating integrated circuits of claim 13 wherein the recited conductive material is everywhere conductively doped polysilicon.

15. The process for fabricating integrated circuits of claim 13 wherein the step of selectively patterning a layer of conductive material atop the insulating layer comprises patterning such layer to provide and exposed third area in the well which is spaced from the base implant region;

wherein the step of doping through the exposed first area also simultaneously comprises doping through the exposed third region to form a collector contact; and wherein the step of patterning the layer of conductive material to expose a second area of the base implant region also comprises masking the third area with photoresist.

16. The process for fabricating integrated circuits of claim 15 wherein the recited conductive material is everywhere conductively doped polysilicon.

* * * * *